(12) United States Patent
Karakida

(10) Patent No.: US 8,981,210 B2
(45) Date of Patent: Mar. 17, 2015

(54) SOLAR BATTERY CELL AND METHOD OF MANUFACTURING THE SOLAR BATTERY CELL

(75) Inventor: Shoichi Karakida, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 126 days.

(21) Appl. No.: 13/696,328

(22) PCT Filed: Jun. 25, 2010

(86) PCT No.: PCT/JP2010/060851
§ 371 (c)(1),
(2), (4) Date: Nov. 6, 2012

(87) PCT Pub. No.: WO2011/161813
PCT Pub. Date: Dec. 29, 2011

(65) Prior Publication Data
US 2013/0048073 A1    Feb. 28, 2013

(51) Int. Cl.
*H01L 31/00* (2006.01)
*H01L 21/00* (2006.01)
(Continued)

(52) U.S. Cl.
CPC ........ *H01L 31/02363* (2013.01); *H01L 31/068* (2013.01); *H01L 31/1804* (2013.01); *Y02E 10/547* (2013.01)
USPC ............................................. 136/256; 438/98

(58) Field of Classification Search
CPC .................................................. H01L 31/02363
USPC ............................................. 438/98; 136/256
See application file for complete search history.

(56) References Cited

U.S. PATENT DOCUMENTS 4,322,571 A * 3/1982 Stanbery ....................... 136/255
6,313,397 B1   11/2001 Washio et al.
(Continued)

FOREIGN PATENT DOCUMENTS

JP           5-95124 A      4/1993
JP      2003-197940 A      7/2003
(Continued)

OTHER PUBLICATIONS

German Office Action dated Sep. 18, 2013, issued in corresponding German Application No. 11 2010 005 695.1 and an English Translation of the Office Action. (19 pgs).
(Continued)

*Primary Examiner* — Eli Mekhlin
(74) *Attorney, Agent, or Firm* — Buchanan Ingersoll & Rooney PC

(57) ABSTRACT

Included are a semiconductor substrate including, on one surface side, a dopant diffusion layer, a light-receiving surface side electrode electrically connected to the dopant diffusion layer and formed on the one surface side of the semiconductor substrate, and a rear surface side electrode formed on the other surface side of the semiconductor substrate. A first unevenness structure including first projected sections each having a square pyramid shape in a light-receiving surface side electrode formation region in which the light-receiving surface side electrode is formed on the one surface side of the semiconductor substrate including the dopant diffusion layer. A second unevenness structure including second projected sections each having a square pyramid shape larger than the first projected sections in a region where the light-receiving surface side electrode is not formed on the one surface side of the semiconductor substrate including the dopant diffusion layer.

8 Claims, 9 Drawing Sheets

(51) Int. Cl.
  *H01L 31/0236* (2006.01)
  *H01L 31/068* (2012.01)
  *H01L 31/18* (2006.01)

(56) References Cited

U.S. PATENT DOCUMENTS

| | | | |
|---|---|---|---|
| 2004/0152326 A1* | 8/2004 | Inomata | 438/705 |
| 2005/0087226 A1 | 4/2005 | Nishida et al. | |
| 2005/0126627 A1 | 6/2005 | Hayashida | |
| 2007/0209697 A1* | 9/2007 | Karakida et al. | 136/256 |
| 2008/0157283 A1* | 7/2008 | Moslehi | 257/618 |

FOREIGN PATENT DOCUMENTS

| | | |
|---|---|---|
| JP | 2004-247595 A | 9/2004 |
| JP | 2005-150614 A | 6/2005 |
| JP | 2008-282912 A | 11/2008 |
| WO | WO 02/31892 A1 | 4/2002 |

OTHER PUBLICATIONS

International Search Report (PCT/ISA/210) issued on Sep. 28, 2010, by the Japanese Patent Office as the International Searching Authority for International Application No. PCT/JP2010/060851.

Written Opinion (PCT/ISA/237) issued on Sep. 28, 2010, by the Japanese Patent Office as the International Searching Authority for International Application No. PCT/JP2010/060851.

Official Action issued by the State Intellectual Property Office of the People's Republic of China on Oct. 30, 2014 in Chinese Application No. 201080067350.X and English language translation of Official Action (11 pgs).

* cited by examiner

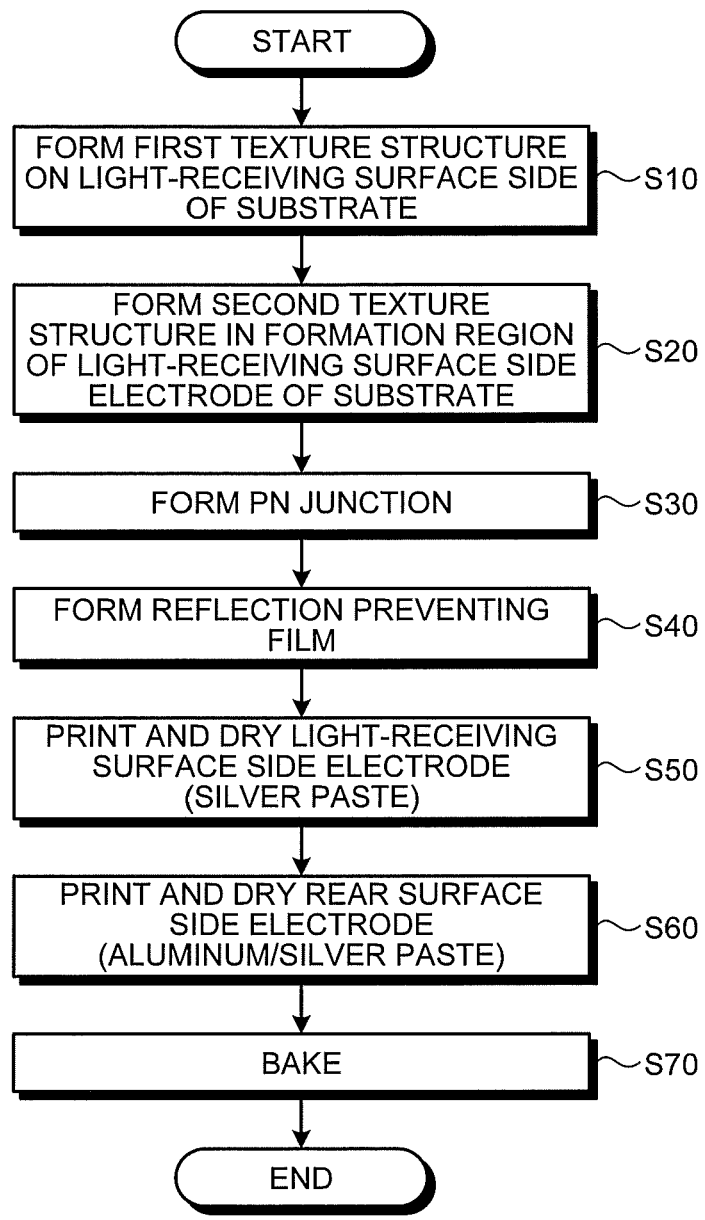

SOLAR BATTERY CELL AND METHOD OF MANUFACTURING THE SOLAR BATTERY CELL

FIELD

The present invention relates to a solar battery cell and a method of manufacturing the solar battery cell and, more particularly, to a solar battery cell for realizing high efficiency and a method of manufacturing the solar battery cell.

BACKGROUND

In the past, a bulk-type solar battery cell is generally manufactured by a method explained below. First, for example, a p-type silicon substrate is prepared as a substrate of a first conduction type. A damage layer on a silicon surface that occurs when the silicon substrate is sliced from a casting ingot is removed by thickness of 10 micrometers to 20 micrometers using, for example, several wt % to 20 wt % of caustic soda or carbonate caustic soda. Thereafter, anisotropic etching is performed using a solution obtained by adding IPA (isopropyl alcohol) to the same alkali low concentration solution to form texture such that a silicon (111) surface is exposed. The formation of the texture does not always have to be performed by wet treatment. The texture can be formed by, for example, dry etching (see, for example, Patent Literature 1).

Subsequently, as diffusion treatment, the p-type silicon substrate is treated under, for example, mixed gas atmosphere of phosphorus oxychloride ($POCl_3$), nitrogen, and oxygen at, for example, 800° C. to 900° C. for several ten minutes to uniformly form an n-type layer on the front surface of the surface of the p-type silicon substrate as a dopant layer of a second conduction type. Sheet resistance of the n-type layer uniformly formed on the silicon surface is set to about 30 to 80Ω/square, whereby satisfactory electric characteristics of a solar battery are obtained. Thereafter, the substrate is immersed in a hydrofluoric acid water solution to etch and remove a vitreous material (PSG) deposited on the front surface during the diffusion treatment.

Subsequently, the n-type layer formed in an unnecessary region such as the rear surface of the substrate is removed. The removal of the n-type layer is performed by, after depositing polymeric resist paste on a light-receiving surface side of the substrate and drying the polymeric resist paste by a screen printing method to protect the n-layer formed on the light-receiving surface side of the substrate, immersing the substrate in, for example, 20 wt % of a potassium hydroxide solution for several minutes. Thereafter, the resist is removed using an organic solvent. As another method of removing the n-type layer on the rear surface or the like of the substrate, there is also a method of performing end face separation using laser or dry etching at the end of the process.

Subsequently, an insulating film such as a silicon oxide film, a silicon nitride film, or a titanium oxide film is formed on the front surface of the n-type layer at uniform thickness as an insulating film for preventing reflection (a reflection preventing film). When the silicon nitride film is formed as the reflection preventing film, a film is formed under a condition of reduced pressure and temperature equal to or higher than 300° C. by, for example, a plasma CVD method using a silane ($SiH_4$) gas and an ammonium ($NH_3$) gas as raw materials. The refractive index of the reflection preventing film is about 2.0 to 2.2. Optimum thickness of the reflection preventing film is about 70 nanometers to 90 nanometers. It should be noted that the reflection preventing film formed in this way is an insulator. A front surface side electrode simply formed on the reflection preventing film does not act as a solar battery.

Subsequently, silver paste to be formed as a front surface side electrode is applied on the reflection preventing film in the shapes of a grid electrode and a bus electrode by the screen printing method using masks for grid electrode formation and for bus electrode formation and dried.

Subsequently, rear aluminum electrode paste to be formed as a rear aluminum electrode and rear silver paste to be formed as a rear silver bus electrode are applied on the rear surface of the substrate respectively in the shape of the rear aluminum electrode and the shape of the rear silver electrode by the screen printing method and dried.

Subsequently, the electrode pastes applied on the front and rear surfaces of the silicon substrate are simultaneously baked at about 600° C. to 900° C. for several minutes. Consequently, the grid electrode and the bus electrode are formed on the reflection preventing film as front surface side electrodes and the rear aluminum electrode and the rear silver bus electrode are formed on the rear surface of the silicon substrate as rear surface side electrodes. On the front surface side of the silicon substrate, a silver material comes into contact with silicon and re-solidifies while the reflection preventing film is melted by a glass material included in the silver paste. Consequently, conduction between the surface side electrodes and the silicon substrate (the n-type layer) is secured. Such a process is called fire-through method. The rear aluminum electrode paste also reacts with the rear surface of the silicon substrate. A p+ layer is formed right under the rear aluminum electrode.

To improve the efficiency of the bulk-type solar battery cell formed as explained above, optimization of an unevenness shape of the surface on the light-receiving surface of the substrate, i.e., the shape of texture is important. In the past, concerning the unevenness shape, a shape optimum for one parameter is applied to the entire surface of a cell. For example, Patent Literature 1 discloses that, when the unevenness shape is formed by dry etching, the unevenness shape is optimized using the reflectance of incident light made incident on a solar battery as a parameter. This is because short-circuit current density, which is one of electric characteristics of the solar battery, is improved by selecting a condition under which the reflectance of the incident light is lower. Concerning a method of forming the texture, for example, Patent Literature 2 discloses that dry etching in multiple stages is carried out. This forming method is aimed at obtaining a uniform unevenness shape over the entire surface of a cell.

CITATION LIST

Patent Literature

Patent Literature 1: Japanese Patent Application Laid-open No. 2005-150614
Patent Literature 2: Japanese Patent Application Laid-open No. 2003-197940

SUMMARY

Technical Problem

However, according to the researches by the inventor, it is found that the other electric characteristics of the solar battery do not always indicate satisfactory characteristics in a bulk-type solar battery in which a texture structure at high short-circuit current density is adopted over the entire surface of a cell.

The present invention has been devised in view of the above and it is an object of the present invention to obtain a solar battery cell having well-balanced electric characteristics and excellent in photoelectric conversion efficiency and a method of manufacturing the solar battery cell.

Solution to Problem

To solve the problem and achieve an object, there is provided a solar battery cell according to the present invention including: a semiconductor substrate of a first conduction type including, on one surface side, a dopant diffusion layer in which a dopant element of a second conduction type is diffused; a light-receiving surface side electrode electrically connected to the dopant diffusion layer and formed on the one surface side of the semiconductor substrate; and a rear surface side electrode formed on the other surface side of the semiconductor substrate, wherein the solar battery cell includes a first unevenness structure including first projected sections having a square pyramid shape in a light-receiving surface side electrode formation region in which the light-receiving surface side electrode is not formed on the one surface side of the semiconductor substrate including the dopant diffusion layer, and the solar battery cell includes a second unevenness structure including second projected sections having a square pyramid shape larger than the first projected sections in a region where the light-receiving surface side electrode is formed on the one surface side of the semiconductor substrate including the dopant diffusion layer.

Advantageous Effects of Invention

According to the present invention, there is an effect that it is possible to obtain a solar battery cell having well-balanced electric characteristics and excellent in photoelectric conversion efficiency.

BRIEF DESCRIPTION OF DRAWINGS

FIG. 1-2 is a characteristic chart of a relation between the length of one side of the square forming the bottom surface of the square pyramid included in the texture structure and a fill factor;

FIG. 1-3 is a characteristic chart of a relation between the length of one side of the square forming the bottom surface of the square pyramid included in the texture structure and photoelectric conversion efficiency;

FIG. 2-1 is a top view of a solar battery cell according to an embodiment of the present invention viewed from a light-receiving surface side;

FIG. 2-2 is a bottom view of the solar battery cell according to the embodiment of the present invention viewed from an opposite side (the rear surface) of the light-receiving surface;

FIG. 2-3 is a main part sectional view of the solar battery cell according to the embodiment of the present invention and is a main part sectional view in an A-A direction in FIG. 2-1;

FIG. 2-4 is a perspective view of a texture structure formed on the surface of a semiconductor substrate of the solar battery cell according to the embodiment of the present invention;

FIG. 3 is a flowchart for explaining an example of a manufacturing process for the solar battery cell according to the embodiment of the present invention;

FIG. 4-1 is a sectional view for explaining the example of the manufacturing process for the solar battery cell according to the embodiment of the present invention;

FIG. 4-2 is a sectional view for explaining the example of the manufacturing process for the solar battery cell according to the embodiment of the present invention;

FIG. 4-3 is a sectional view for explaining the example of the manufacturing process for the solar battery cell according to the embodiment of the present invention;

FIG. 4-4 is a sectional view for explaining the example of the manufacturing process for the solar battery cell according to the embodiment of the present invention;

FIG. 4-5 is a sectional view for explaining the example of the manufacturing process for the solar battery cell according to the embodiment of the present invention;

FIG. 4-6 is a sectional view for explaining the example of the manufacturing process for the solar battery cell according to the embodiment of the present invention;

FIG. 4-7 is a sectional view for explaining the example of the manufacturing process for the solar battery cell according to the embodiment of the present invention;

FIG. 4-8 is a sectional view for explaining the example of the manufacturing process for the solar battery cell according to the embodiment of the present invention;

FIG. 4-9 is a sectional view for explaining the example of the manufacturing process for the solar battery cell according to the embodiment of the present invention; and FIG. 4-10 is a sectional view for explaining the example of the manufacturing process for the solar battery cell according to the embodiment of the present invention.

DESCRIPTION OF EMBODIMENTS

Figure 1:
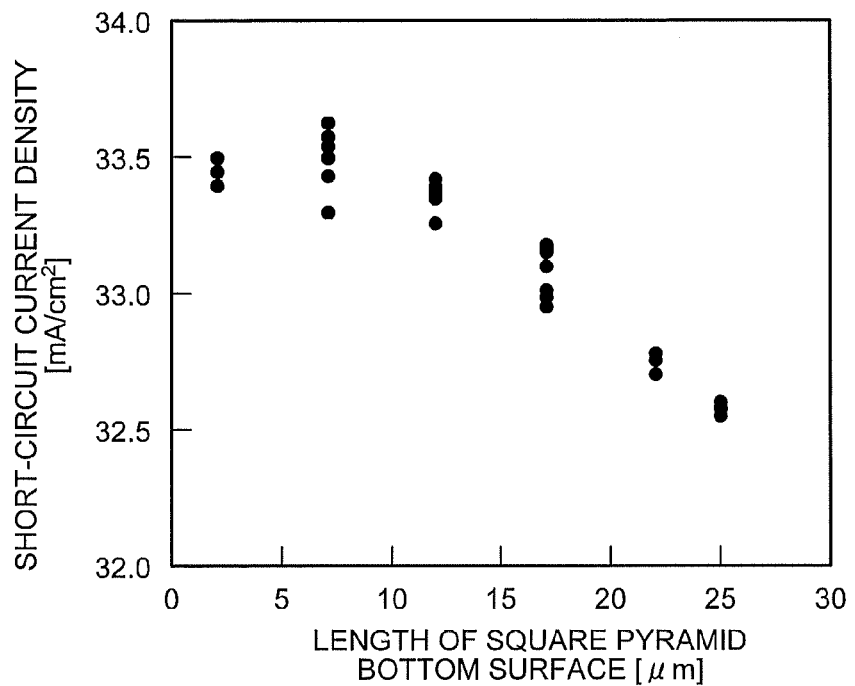
FIG. 1-1 is a characteristic chart of a relation between the length of one side of a square forming the bottom surface of a square pyramid included in a texture structure and short-circuit current density.

An embodiment of a solar battery cell and a method of manufacturing the solar battery cell is explained in detail below based on the drawings. The present invention is not limited by the following description and can be changed as appropriate without departing from the gist of the present invention. In the drawings referred to below, for easiness of understanding, scales of members are sometimes different from actual scales. The same holds true among the drawings.

Embodiment

A texture structure formed on a bulk-type solar battery cell is originally aimed at suppressing light reflection and capturing sunlight into a substrate as much as possible. Therefore, the texture structure is considered to substantially act on an electric characteristic of short-circuit current density. Therefore, in optimization of the shape of texture, it is a general practice to select a shape that makes the reflectance of incident light as low as possible.

However, according to the researches by the inventor, it is found that the other electric characteristics do not always indicate satisfactory characteristics in a bulk-type solar battery in which a texture structure having an effect of improving the short-circuit current density is adopted over the entire surface of a cell. In other words, it is found that the texture structure having the effect of improving the short-circuit current density does not always have an effect of improving the other electric characteristics and, depending on a type of an electric characteristic, there is a texture structure effective for improvement of the characteristic.

Figures 1, 2:
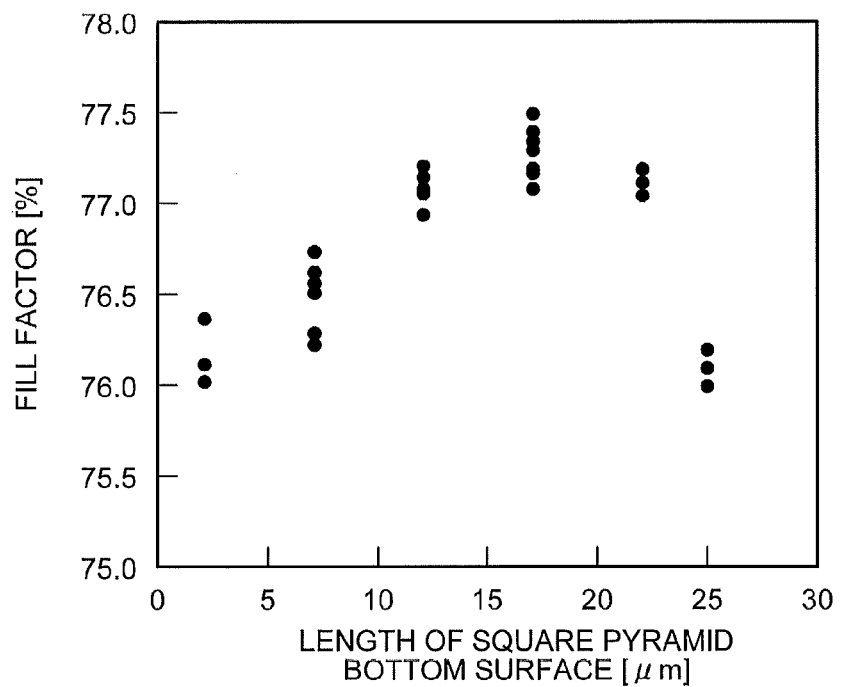
Figures 1, 2, 3:
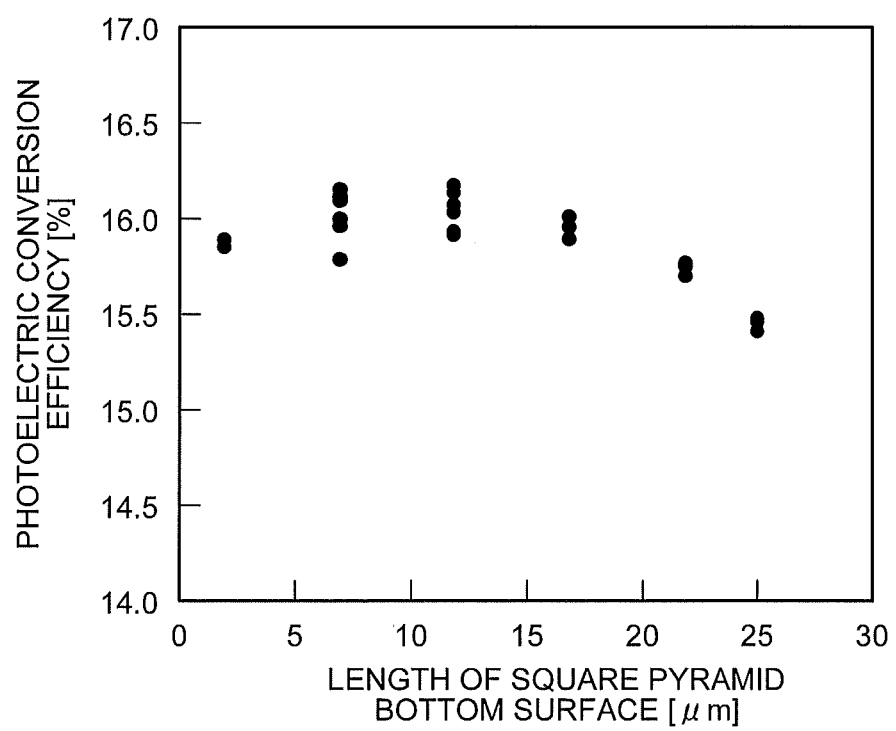

FIGS. 1-1 to 1-3 are characteristic charts representing relations between the length of one side of a square forming the bottom surface of a square pyramid included in a texture Structure formed on a substrate surface of a monocrystal silicon solar battery cell by alkali wet etching and electric characteristics of the solar battery cell. FIG. 1-1 is a characteristic chart of a relation between the length of the one side of the square forming the bottom surface of the square pyramid included in the texture structure and short-circuit current density [mA/cm$^2$]. FIG. 1-2 is a characteristic chart of a relation between the length of the one side of the square forming the bottom surface of the square pyramid included in the texture structure and a fill factor [%]. FIG. 1-3 is a characteristic chart of a relation between the length of the one side of the square forming the bottom surface of the square pyramid included in the texture structure and photoelectric conversion efficiency. A plurality of monocrystal silicon solar battery cells, in which a square pyramid is formed as a texture structure on the surface on a light-receiving surface side of a monocrystal silicon substrate by etching using an alkali solution, are formed by changing the length of one side of a square forming the bottom surface of the square pyramid. Characteristics of the monocrystal silicon solar battery cells are measured. The characteristics are shown in FIGS. 1-1 to 1-3. Structures of the same standard cannot always be uniformly formed in a plane because of characteristics of manufacturing. Therefore, concerning the length of one side of the square forming the bottom surface of the square pyramid included in the texture structure, a length of one side of a square forming the bottom surface regarding the square pyramids occupying 60% or more of the entire texture structure is adopted. In the present invention, the square pyramid means a regular square pyramid, the shape of the bottom surface of which is a substantial square.

When FIG. 1-1 and FIG. 1-2 are compared, it is seen that the relations between the length of one side of the square forming the bottom surface of the square pyramid included in the texture structure and the short-circuit current density and the fill factor indicate tendencies of opposite correlations. Specifically, as it is seen from FIG. 1-1, the short-circuit current density tends to decrease as the length of one side of the square forming the bottom surface of the square pyramid included in the texture structure is longer. This means that, in terms of improvement of the short-circuit current density, the length of one side of the square forming the bottom surface of the square pyramid is desirably shorter. However, when the length of one side of the square forming the bottom surface of the square pyramid is too short, the short-circuit current density decreases. This is because a damage layer on a silicon surface that occurs when a silicon substrate is sliced from a casting ingot remains. Therefore, judging from the above, in terms of improvement of the short-circuit current density, it can be considered that the length of one side of the square forming the bottom surface of the square pyramid included in the texture structure is desirably set in a range of 2 micrometers to 12 micrometers.

On the other hand, as it is seen from FIG. 1-2, the fill factor tends to increase as the length of one side of the square forming the bottom surface of the square pyramid included in the texture structure is longer. This means that, in terms of improvement of the fill factor, the length of one side of the square forming the bottom surface of the square pyramid is desirably longer. However, when the length of one side of the square forming the bottom surface of the square pyramid is too long, the fill factor decreases. This is because, since unevenness on the substrate surface is too large, a light-receiving surface electrode formed on the substrate surface is disconnected. Therefore, judging from the above, it can be considered that the length of one side of the square forming the bottom surface of the square pyramid included in the texture structure is desirably set in a range of 12 micrometers to 22 micrometers.

As a result, when a texture structure having a uniform length of one side of the square forming the bottom surface of the square pyramid is adopted over the entire surface of a cell, as shown in FIG. 1-3, cell photoelectric conversion efficiency, which is a product of the short-circuit current density, the fill factor, and an open-circuit voltage (not shown in the figure), has an optimum value near an intermediate point of optimum values of the short-circuit current density and the fill factor. This is because optimum values of the length of one side of the square forming the bottom surface of the square pyramid in the respective electric characteristics cannot be utilized to the maximum extent.

In the present invention, concerning the texture structure formed on the substrate surface on the light-receiving surface side of the solar battery cell, in a light-receiving region having a close correlation with improvement of the short-circuit current density (a region excluding a region of a light-receiving surface side electrode on the light-receiving surface side of the solar battery cell and is a region where light is actually received), the length of one side of the square forming the bottom surface of the square pyramid included in the texture structure is set in a range of 2 micrometers to 12 micrometers to improve the short-circuit current density and improve the photoelectric conversion efficiency. In a lower region of the light-receiving surface side electrode, which is a region where light is not received on the light-receiving surface side of the solar battery cell, the length of one side of the square forming the bottom surface of the square pyramid included in the texture structure is set in a range of 12 micrometers to 22 micrometers to improve the fill factor and improve the photoelectric conversion efficiency. In this way, in the present invention, the length of one side of the square forming the bottom surface of the square pyramid included in the texture structure is adopted as a reference for specifying the texture structure.

Consequently, it is possible to adopt satisfactory conditions for each of the short-circuit current density, the fill factor, and the photoelectric conversion efficiency. It is possible to realize a solar battery cell excellent in the photoelectric conversion efficiency by improving both of the short-circuit current density and the fill factor in a well-balanced state.

Figures 1, 2:
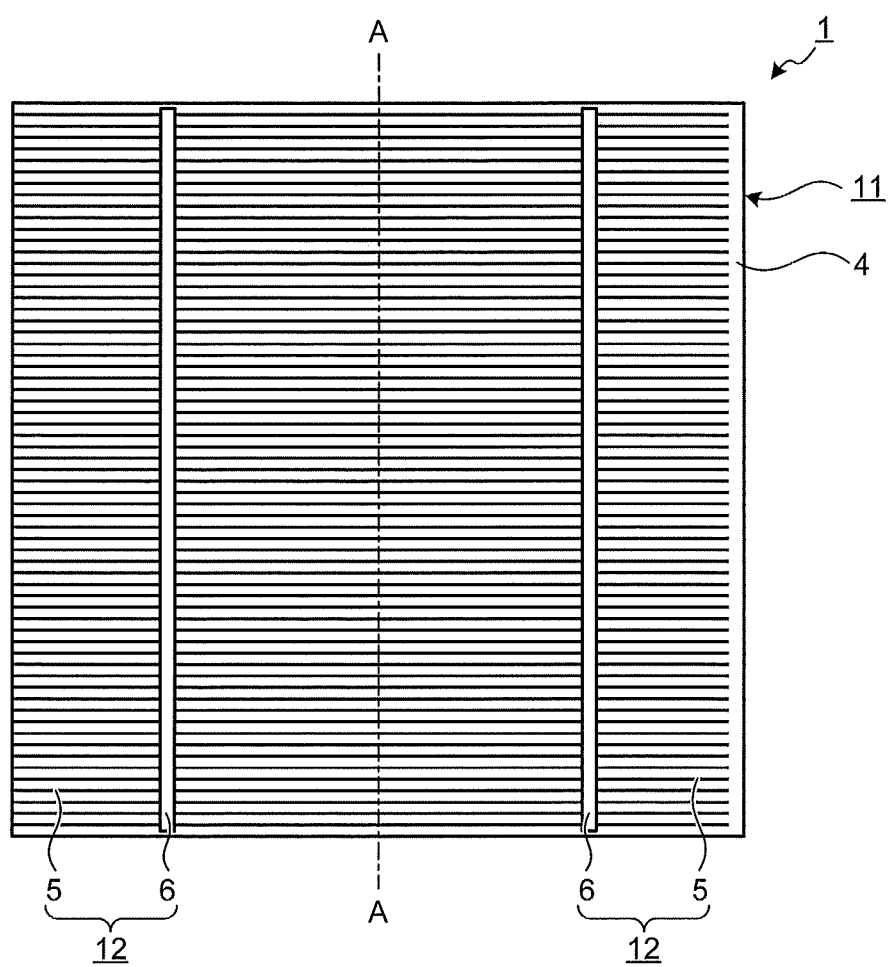
Figure 2:
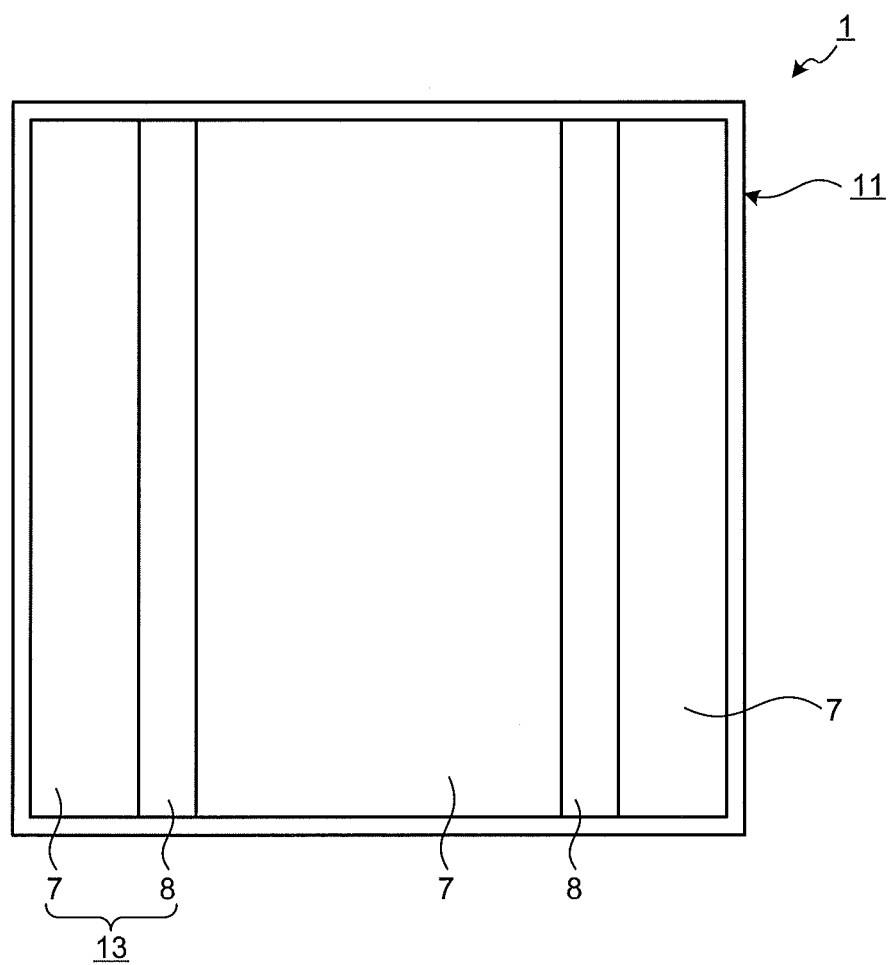
Figures 2, 3:
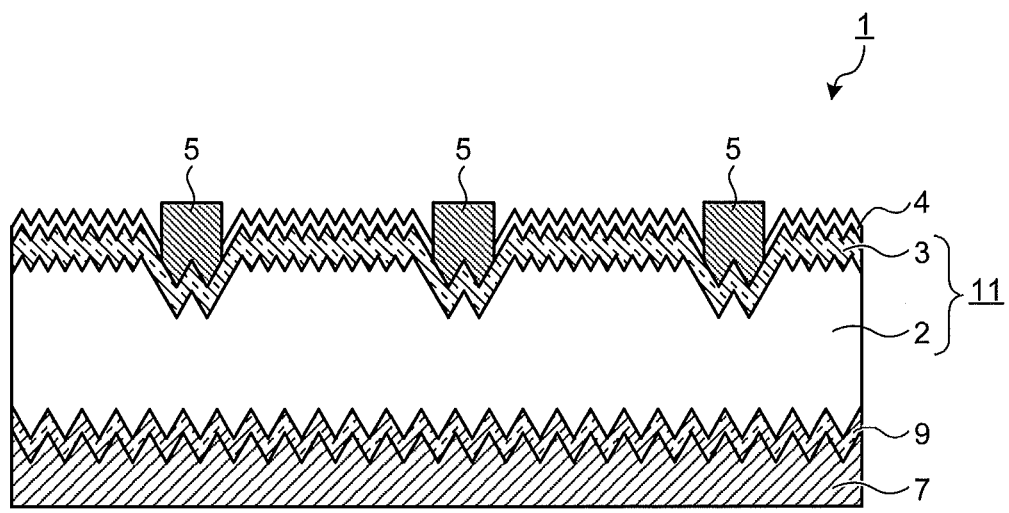
Figures 2, 3, 4:
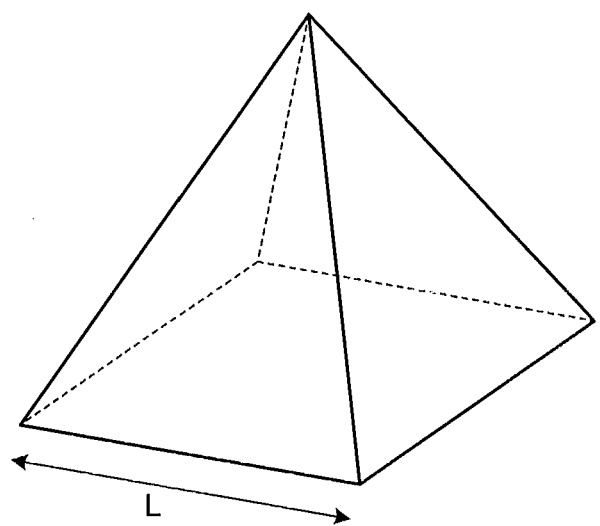

FIGS. 2-1 to 2-4 are diagrams for explaining the configuration of a solar battery cell 1 according to the embodiment of the present invention. FIG. 2-1 is a top view of the solar battery cell 1 viewed from a light-receiving surface side. FIG. 2-2 is a bottom view of the solar battery cell 1 viewed from the opposite side (the rear surface) of the light-receiving surface. FIG. 2-3 is a main part sectional view of the solar battery cell 1 and is a main part sectional view in an A-A direction in FIG. 2-1. FIG. 2-4 is a perspective view of a texture structure formed on the surface of a semiconductor substrate of the solar battery cell 1. The solar battery cell 1 is a silicon solar battery used for a house and the like.

In the solar battery cell 1 according to this embodiment, an n-type dopant diffusion layer 3 is formed by phosphor diffusion on a light-receiving surface side of a semiconductor substrate 2 formed of p-type monocrystal silicon and a semiconductor substrate 11 having pn junction is formed. A reflection preventing film 4 formed of a silicon oxide film (SiN film) is formed on the n-type dopant diffusion layer 3. The semiconductor substrate 2 is not limited to the p-type monocrystal silicon substrate. A p-type polycrystal silicon substrate, an n-type polycrystal silicon substrate, and an n-type monocrystal silicon substrate can be used.

On the surface on the light-receiving surface side of the semiconductor substrate 11 (the n-type dopant diffusion layer 3), a fine unevenness shape having texture (a square pyramid) shown in FIG. 2-4 is formed as a texture structure. The texture structure is a structure that increases an area for absorbing light from the outside on a light-receiving surface, suppresses reflectance on the light-receiving surface, and traps the light.

In the solar battery cell 1 according to this embodiment, in a light-receiving region having a close correlation with improvement of the short-circuit current density (a region excluding a region of a light-receiving surface side electrode on the light-receiving surface side of the solar battery cell and is a region where light is actually received), a length L of one side of a square forming the bottom surface of the square pyramid included in the texture structure is set in a range of 2 micrometers to 12 micrometers. If the texture structure of the light-receiving region satisfies such a condition, it is possible to further reduce the reflectance of incident light made incident on the semiconductor substrate 11 to contribute to improvement of the short-circuit current density, which is one of the electric characteristics of the solar battery, and improve the photoelectric conversion efficiency.

In a lower region of the light-receiving surface side electrode, which is a region where light is not received on the light-receiving surface side of the solar battery cell, the length L of one side of the square forming the bottom surface of the square pyramid included in the texture structure is set in a range of 12 micrometers to 22 micrometers. If the texture structure of the lower region of the light-receiving surface side electrode satisfies such a condition, it is possible to contribute to improvement of the fill factor and improve the photoelectric conversion efficiency.

The length L of one side of the square forming the bottom surface of the square pyramid included in the texture structure is varied in the light receiving region and the lower region of the light-receiving surface side electrode as explained above. Consequently, it is possible to adopt satisfactory conditions for each of the short-circuit density and the fill factor. Further, it is possible to realize a solar battery cell excellent in the photoelectric conversion efficiency by improving both of the short-circuit current density and the fill factor in a well-balanced state.

The reflection preventing film 4 is formed of an insulating film for reflection prevention such as a silicon nitride film (SiN film), a silicon oxide film ($SiO_2$ film), or a titanium oxide film ($TiO_2$). On the light-receiving surface side of the semiconductor substrate 11, a plurality of elongated and thin front silver grid electrodes 5 are provided side by side. Front silver bus electrodes 6 conducting to the front silver grid electrodes 5 are provided to be substantially orthogonal to the front silver grid electrodes 5. Each of the front silver grid electrodes 5 and the front silver bus electrodes 6 are electrically connected to the n-type dopant diffusion layer 3 in bottom surface sections thereof. The front silver grid electrodes 5 and the front silver bus electrodes 6 are formed of a silver material.

The front silver grid electrodes 5 have width of, for example, about 100 micrometers to 200 micrometers. The front silver grid electrodes 5 are arranged substantially in parallel at an interval of about 2 millimeters. The front silver grid electrodes 5 collect electricity generated on the inside of the semiconductor substrate 11. The front silver bus electrodes 6 have width of, for example, about 1 millimeter to 3 millimeters. Two to four front silver bus electrodes 6 are arranged per one solar battery cell. The front silver bus electrodes 6 extract the electricity collected by the front silver grid electrodes 5 to the outside. Light-receiving surface side electrodes 12, which are first electrodes, are formed by the front silver grid electrodes 5 and the front silver bus electrodes 6. The light-receiving surface side electrodes 12 block sunlight made incident on the semiconductor substrate 11. Therefore, in terms of improvement of power generation efficiency, it is desirable to set an area of the light-receiving surface side electrodes 12 as small as possible. In general, the light-receiving surface side electrodes 12 are arranged as the front silver grid electrodes 5 of a comb shape and the front silver bus electrodes 6 of a bar shape shown in FIG. 2-1.

As an electrode material of the light-receiving surface side electrode of the silicon solar battery cell, usually, silver paste is used. For example, lead boron glass is added to the electrode material. The glass is a flit-like glass. The glass is made of the composition of 5 to 30 wt % of lead (Pb), 5 to 10 wt % of boron (B), 5 to 15 wt % of silicon (Si), and 30 to 60 wt % of oxygen (O). Further, about several wt % of zinc (Zn), cadmium (Cd), and the like are sometimes mixed. Such lead boron glass has a characteristic that the lead boron glass is melted by heating at several hundred degrees centigrade (e.g., 800° C.) and, when being melted, erodes silicon. In general, in a method of manufacturing a crystal silicon solar battery cell, a method of obtaining electrical contact of a silicon substrate and silver paste making use of the characteristic of the glass flit is used.

On the other hand, on the rear surface (a surface on the opposite side of the light-receiving surface) of the semiconductor substrate 11, a rear aluminum electrode 7 formed of an aluminum material is provided over the entire rear surface. Rear silver electrodes 8 formed of a silver material are provided extending in substantially the same direction as the front silver bus electrodes 6. Rear surface side electrodes 13, which are second electrodes, are formed by the rear aluminum electrode 7 and the rear silver electrodes 8. The rear aluminum electrode 7 is expected to also have a BSR (Back Surface Reflection) effect of reflecting long wavelength light, which passes through the semiconductor substrate 11, and reusing the light for power generation.

In terms of a reduction in costs and improvement of performance, in general, silver is used as the material of the light-receiving surface side electrodes 12 and aluminum is used as the material of the rear surface side electrodes and, when necessary, a material including silver as a main component is used in a part of a region of the rear surface side electrode.

In a front layer section on the rear surface (a surface on the opposite side of the light-receiving surface) side of the semiconductor substrate 11, a p+ layer (BSF (Back Surface Field)) 9 including high-concentration dopants is formed. The p+ layer (BSF) 9 is provided to obtain a BSF effect. The p+ layer (BSF) 9 increases electron concentration of the p-type layer (the semiconductor substrate 2) using an electric field of a band structure to prevent electrons in the p-type layer (the semiconductor substrate 2) from disappearing.

In the solar battery cell 1 configured as explained above, when sunlight is irradiated on a pn junction surface of the semiconductor substrate 11 (a joining surface of the semiconductor substrate 2 and the n-type dopant diffusion layer 3) from the light-receiving surface side of the solar battery cell 1, holes and electrons are generated. The generated electrons move to the n-type dopant diffusion layer 3 and the generated holes move to the p+ layer 9 with an electric field of a pn junction section. Consequently, electrons are excessively present in the n-type dopant diffusion layer 3 and holes are excessively present in the p+ layer 9. As a result, photoelectromotive force is generated. The photoelectromotive force is generated in a direction for biasing the pn junction in a forward direction. The light-receiving surface side electrodes 12 connected to the n-type dopant diffusion layer 3 become minus electrodes. The rear aluminum electrode 7 connected to the p+ layer 9 becomes a plus electrode. An electric current flows to a not-shown external circuit.

In the solar battery cell 1 according to this embodiment configured as explained above, a texture shape, which is uniform over the entire surface of the solar battery cell in the past, is optimized for lower regions and light-receiving regions of the light-receiving surface side electrodes 12. Therefore, it is possible to increase the photoelectric conversion efficiency of the solar battery cell 1.

Specifically, in the solar battery cell 1, the length L of one side of the square forming the bottom surface of the square pyramid included in the texture structure is varied in the light-receiving region and the lower region of the light-receiving surface side electrode. In the light-receiving region having a close correlation with improvement of the short-circuit current density, the length L of one side of the square forming the bottom surface of the square pyramid included in the texture structure is set in a range of 2 micrometers to 12 micrometers. In the lower region of the light-receiving surface side electrode, which is a region where light is not received on the light-receiving surface side of the solar battery cell, the length L of one side of the square forming the bottom surface of the square pyramid included in the texture structure is set in a range of 12 micrometers to 22 micrometers. Consequently, it is possible to adopt satisfactory conditions for each of the short-circuit current density and the fill factor. It is possible to realize a solar battery cell excellent in the photoelectric conversion effect by improving both of the short-circuit current density and the fill factor in a well-balanced state.

In the above explanation, the silicon solar battery cell in which the monocrystal silicon substrate is used as the semiconductor substrate is explained as an example. However, in the present invention, as long as formation of the texture structure of the square pyramid is possible, the effects can be obtained in the same manner even when a substrate formed of a material other than silicon is used as the semiconductor substrate and when a substrate formed of crystal other than monocrystal is used as the semiconductor substrate.

A method of manufacturing the solar battery cell 1 according to this embodiment is explained below with reference to the drawings. FIG. 3 is a flowchart for explaining an example of a manufacturing process for the solar battery cell 1 according to the embodiment of the present invention. FIGS. 4-1 to 4-10 are sectional views for explaining an example of the manufacturing process for the solar battery cell 1 according to the embodiment of the present invention. FIGS. 4-1 to 4-10 are main part sectional views corresponding to FIG. 2-3.

First, a p-type monocrystal silicon substrate having thickness of, for example, several hundred micrometers is prepared as the semiconductor substrate 2 (FIG. 4-1). The p-type monocrystal silicon substrate is manufactured by slicing, with a wire saw, an ingot obtained by cooling and solidifying melted silicon. Therefore, damage during the slicing remains on the surface of the p-type monocrystal silicon substrate. Therefore, the p-type monocrystal silicon substrate is immersed in acid or a heated alkali solution, for example, a sodium hydroxide water solution to etch the surface, whereby a damage region caused during slicing of the silicon substrate and present near the surface of the p-type monocrystal silicon substrate is removed. For example, the surface is removed by thickness of 10 micrometers to 20 micrometers using, for example, several to 20 wt % of caustic soda or carbonate caustic soda. The p-type silicon substrate used as the semiconductor substrate 2 may be either a monocrystal silicon substrate or a polycrystal silicon substrate. However, a p-type monocrystal silicon substrate having specific resistance of 0.1 $\Omega \cdot cm$ to 5 $\Omega \cdot cm$ and a (100) plane orientation is explained as an example.

Following the damage removal, anisotropic etching is performed using a solution obtained by adding an additive agent for facilitating the anisotropic etching such as IPA (isopropyl alcohol) to the same alkali low concentration solution, for example, several wt % of alkali liquid such as caustic soda or carbonate caustic soda to form very small unevenness (square pyramids) on the surface on the light-receiving surface side of the p-type monocrystal silicon substrate such that a silicon (111) surface is exposed and form a texture structure 2a as a first texture structure (step S10, FIG. 4-2). Treatment time in this step is determined in advance such that the length L of one side of a square forming the bottom surface of a square pyramid included in the texture structure 2a is in a range of 2 micrometers to 12 micrometers, for example, about 5 micrometers.

Such a texture structure is provided on the light-receiving surface side of the p-type monocrystal silicon substrate. Consequently, it is possible to cause multiple reflection of light on the front surface side of the solar battery cell 1 and cause the semiconductor substrate 11 to efficiently absorb light made incident on the solar battery cell 1. It is possible to effectively reduce reflectance and improve conversion efficiency. When the removal of the damage layer and the formation of the texture structure are performed using an alkali solution, the alkali solution is sometimes adjusted to concentrations corresponding to the respective purposes to perform continuous treatment. When the p-type monocrystal silicon substrate is immersed in the solution, a texture structure is formed on the rear surface (a surface on the opposite side of the light-receiving surface side) of the p-type monocrystal silicon substrate.

Subsequently, for example, a silicon nitride film is formed on the surface on the light-receiving surface side of the semiconductor substrate 2 as a mask film 21 having etching resistance against the alkali low concentration solution (FIG. 4-3). In the mask film 21, regions corresponding to formation regions of the light-receiving surface side electrodes 12 on the surface on the light-receiving surface side of the semiconductor substrate 2 are removed to form openings 21a (FIG. 4-4). Concerning a method of opening the mask film 21, an optimum technology can be selected in publicly-known methods such as photoengraving and laser irradiation. In a state shown in FIG. 4-4, the openings 21a are formed in regions corresponding to formation regions of the front silver grid electrodes 5 in the mask film 21.

Subsequently, the anisotropic etching is performed again using the solution obtained by adding the additive agent for facilitating the anisotropic etching such as IPA (isopropyl alcohol) to about several wt % of the alkali low concentration solution. Consequently, portions where the mask film 21 is opened on the light-receiving surface side of the semiconductor substrate 2 are etched again. Texture structures 2b are formed in formation regions of the light-receiving surface side electrodes 12 as a second texture structure having unevenness (square pyramids) shape larger than that of the texture structure 2a (step S20, FIG. 4-5). Treatment time in this step is determined in advance such that the length L of one side of a square forming the bottom surface of a square pyramid included in the texture structure 2b is in a range of 12 micrometers to 22 micrometers, for example, about 15 micrometers. The concentration of the alkali solution and the IPA used during the etching does not have to be the same as the concentration of the alkali solution and the IPA used when the texture structure 2a is formed.

Figures 1, 4:
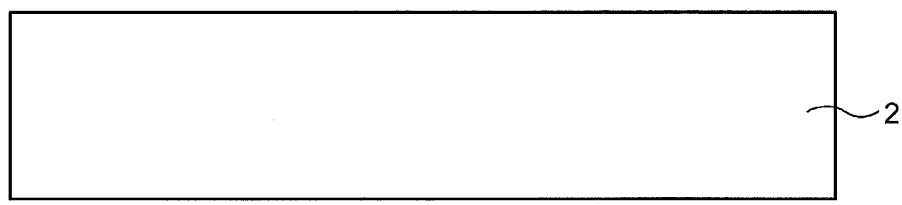
Figures 2, 4:
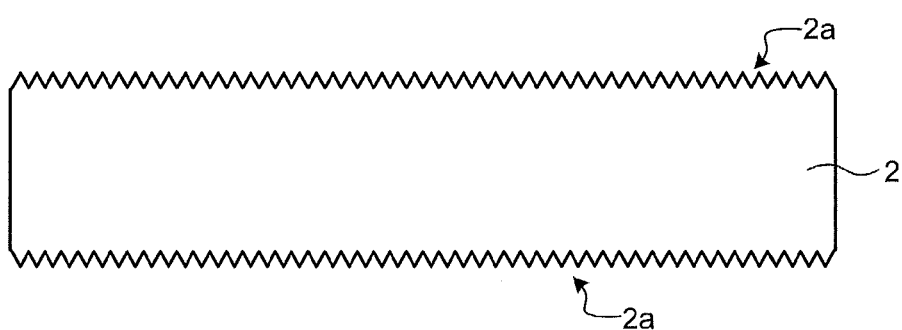
Figures 3, 4:
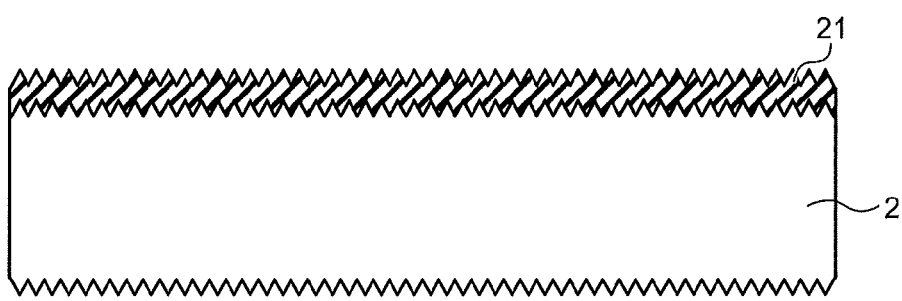
Figure 4:
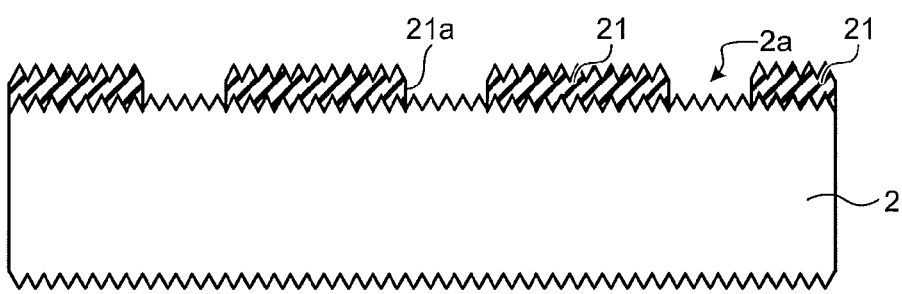
Figures 4, 5:
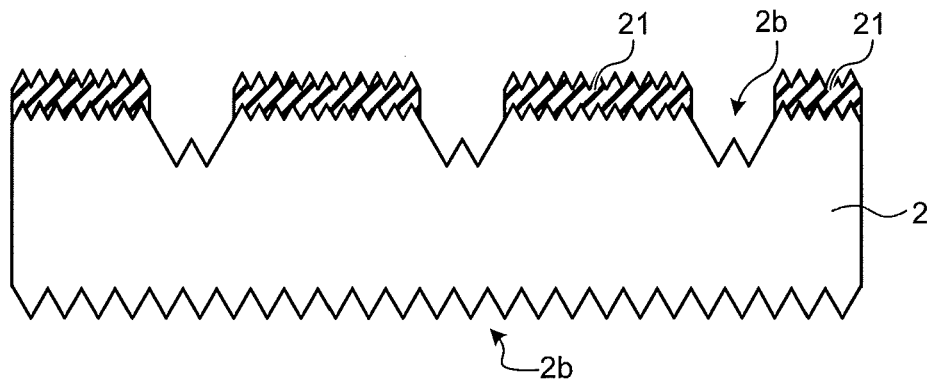
Figures 4, 5, 6:
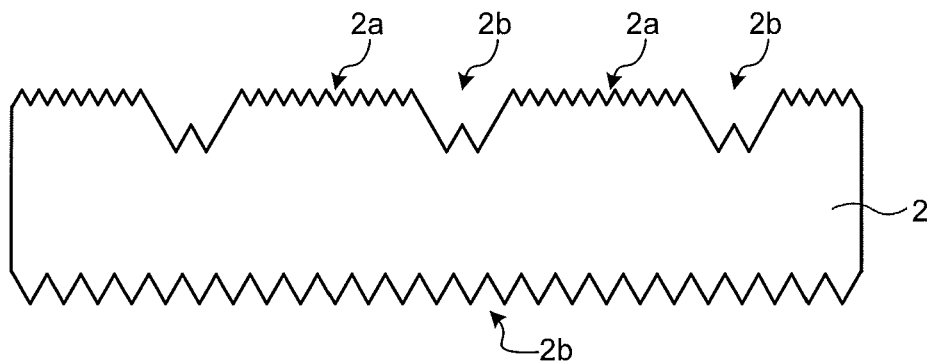
Figures 4, 5, 6, 7:
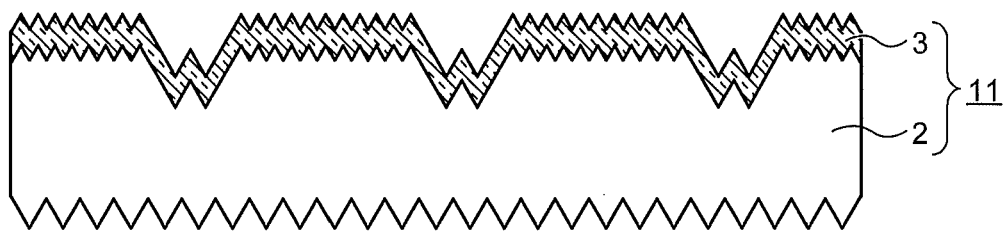
Figures 4, 5, 6, 7, 8:
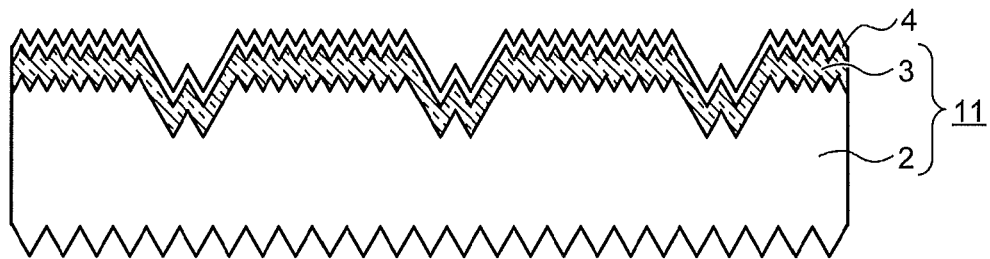
Figures 4, 5, 6, 7, 8, 9:
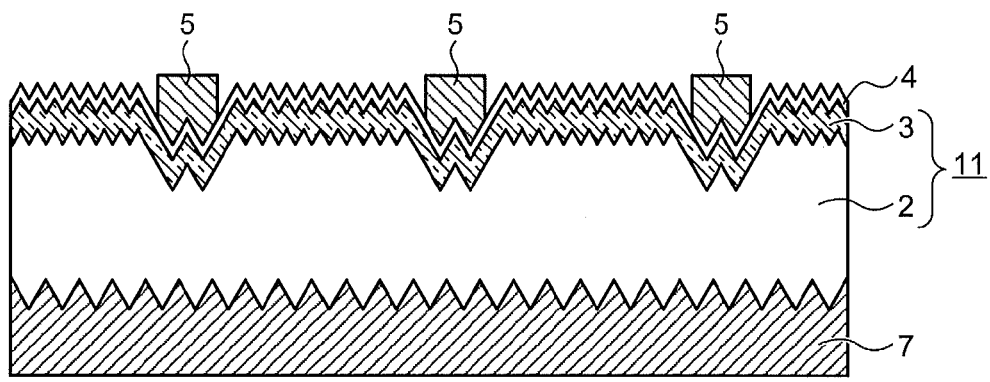
Figures 4, 5, 6, 7, 8, 9, 10:
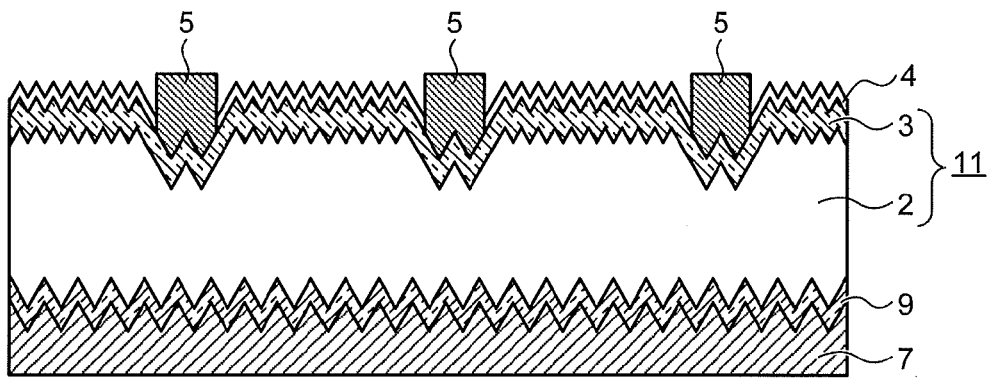

Subsequently, the silicon nitride film of the mask film 21 is removed using, for example, a hydrofluoric acid solution (FIG. 4-6). The etching treatment at the two stages is carried out as explained above, whereby the texture structure 2a in which the length L of one side of the square forming the bottom surface of the square pyramid included in the unevenness structure is set to, for example, about 5 micrometers is formed in the region, which becomes the light receiving region on the light-receiving surface side of the semiconductor substrate 2. The texture structures 2b in which the length L of one side of the square forming the bottom surface of the square pyramid included in the unevenness structure is longer than that of the texture structure 2a and set to, for example, about 15 micrometers are formed in the regions where the light-receiving surface side electrodes 12 are formed on the light-receiving surface side of the semiconductor substrate 2. The texture structures 2b are formed over the entire surface on the rear surface side of the semiconductor substrate 2.

Subsequently, pn junction is formed on the semiconductor substrate 2 (step S30, FIG. 4-7). Specifically, a group V element such as phosphorus (P) is, for example, diffused on the semiconductor substrate 2 to form the n-type dopant diffusion layer 3 having thickness of several hundred nanometers. Phosphorus oxychloride ($POCl_3$) is diffused on the p-type monocrystal silicon substrate, on the surface of which the texture structures are formed, by thermal diffusion to form pn junction. Consequently, the semiconductor substrate 11 is obtained in which the pn junction is formed by the semiconductor substrate 2 formed of the p-type monocrystal silicon, which is a first conduction type layer, and the n-type dopant diffusion layer 3, which is a second conduction type layer, formed on the light-receiving surface side of the semiconductor substrate 2.

In this diffusion process, the p-type monocrystal silicon substrate is subjected to thermal diffusion in, for example, mixed gas atmosphere of a phosphorus oxychloride ($POCl_3$) gas, a nitrogen gas, and an oxygen gas at high temperature of, for example, 800° C. to 900° C. for several ten minutes to uniformly form the n-type dopant diffusion layer 3, in which phosphorus (P) is diffused, on the surface layer of the p-type monocrystal silicon substrate. When a range of sheet resistance of the n-type dopant diffusion layer 3 formed on the front surface of the semiconductor substrate 2 is about 30Ω/square to 80Ω/square, satisfactory electric characteristics of a solar battery are obtained.

A glass material (Phospho-Silicate Glass (PSG)) layer deposited on the surface during the diffusion treatment is formed on the surface immediately after the formation of the n-type dopant diffusion layer 3. Therefore, the phosphorus glass layer is removed using a hydrofluoric acid solution.

Although not shown in the figure, the n-type dopant diffusion layer 3 is formed over the entire surface of the semiconductor substrate 2. Therefore, to eliminate the influence of the n-type dopant diffusion layer 3 formed on the rear surface of the semiconductor substrate 2 and the like, the n-type dopant diffusion layer 3 is left only on the light-receiving surface side of the semiconductor substrate 2 and the n-type dopant diffusion layer 3 in the other regions is removed.

For example, to protect the n-type dopant diffusion layer 3 on the light-receiving surface side of the semiconductor substrate 2, polymeric resist paste is applied to the light-receiving surface side of the semiconductor substrate 2 by the screen printing method and dried. The semiconductor substrate 2 is immersed in, for example, 20 wt % of a potassium hydroxide solution for several minutes to remove the n-type dopant diffusion layer 3 formed on the surface other than the light-receiving surface side of the semiconductor substrate 2. Thereafter, the polymeric resist is removed using an organic solvent. Consequently, the n-type dopant diffusion layer 3 can be left only on the light-receiving surface side of the semiconductor substrate 2. As another method performed for eliminating the influence of the n-type dopant diffusion layer 3 on the rear surface of the semiconductor substrate 2 and the like, end face separation is sometimes performed by laser or dry etching at the end of the process. The n-type dopant diffusion layer 3 can be formed in advance only on the light-receiving surface side of the semiconductor substrate 2.

Subsequently, for improvement of the photoelectric conversion efficiency, the reflection preventing film 4 is formed at uniform thickness over the entire surface on the light-receiving surface side of the p-type monocrystal silicon substrate (step S40, FIG. 4-8). The thickness and the refractive index of the reflection preventing film 4 are set to values for suppressing light reflection most. A silicon nitride film is formed as the reflection preventing film 4 under a condition of reduced pressure and temperature equal to or higher than 300° C. by, for example, the plasma CVD method using a mixed gas of a silane ($SiH_4$) gas and an ammonium ($NH_3$) gas as a raw material. The refractive index of the reflection preventing film 4 is about 2.0 to 2.2. Optimum thickness of the reflection preventing film 4 is about 70 nanometers to 90 nanometers. As the reflection preventing film 4, films of two or more layers having different refractive indexes can be laminated. As a method of forming the reflection preventing film 4, an evaporation method, a thermal CVD method, and the like can be used besides the plasma CVD method. It should be noted that the reflection preventing film 4 formed in this way is an insulator. The light-receiving surface side electrodes 12 simply formed on the reflection preventing film 4 do not act as a solar battery.

Subsequently, electrodes are formed by screen printing. First, the light-receiving surface side electrodes 12 are formed (before baking). Specifically, after silver paste 12a, which is electrode material paste including glass flit, is applied on the reflection preventing film 4, which is the light-receiving surface of the p-type monocrystal silicon substrate, in the shapes of the front silver grid electrodes 5 and the front silver bus electrodes 6 by the screen printing, the silver paste is dried (step S50, FIG. 4-9).

Subsequently, aluminum paste 7a, which is electrode material paste, is applied on the rear surface side of the p-type monocrystal silicon substrate in the shape of the rear aluminum electrode 7 by the screen printing. Silver paste, which is electrode material paste, is further applied in the shape of the rear silver electrodes 8 and dried (step S60, FIG. 4-9). In the figure, only the aluminum paste 7a is shown and the silver paste is not shown.

Thereafter, the electrode pastes on the front surface and the rear surface of the semiconductor substrate 11 are simultaneously baked at 600° C. to 900° C., whereby, on the front side of the semiconductor substrate 11, a silver material comes into contact with silicon and re-solidifies while the reflection preventing film 4 is melted by a glass material included in the silver paste 12a. Consequently, the front silver grid electrodes 5 and the front silver bus electrodes 6 functioning as the light-receiving surface side electrodes 12 are obtained and conduction of the light-receiving surface side electrodes 12 and the silicon of the semiconductor substrate 11 is secured (step S70, FIG. 4-10). Such a process is called fire-through method.

The aluminum paste 7a also reacts with the silicon of the semiconductor substrate 11 and the rear aluminum electrode 7 is obtained. The p+ layer 9 is formed right under the rear aluminum electrode 7. The silver material of the silver paste comes into contact with the silicon and re-solidifies and the rear silver electrodes 8 are obtained (FIG. 4-10). In the figure, only the front silver grid electrodes 5 and the rear aluminum electrode 7 are shown. The front silver bus electrodes 6 and the rear silver electrodes 8 are not shown.

If the diffusion process is carried out after each of the step in FIG. 4-2 and the step in FIG. 4-5, further improvement of efficiency can be expected. Sheet resistance in that case is desirably about 100Ω/square to 70Ω/square in the diffusion after the step in FIG. 4-2. In the diffusion after the step in FIG. 4-5, the sheet resistance is desirably set to a target of 60Ω/square to 40Ω/square higher than the sheet resistance in the diffusion after the step in FIG. 4-2.

In the method of manufacturing the solar battery cell according to this embodiment explained above, a texture shape, which is uniform over the entire surface of the solar battery cell in the past, is optimized for the lower regions and the light-receiving regions of the light-receiving surface side electrodes 12. Therefore, it is possible to increase the photoelectric conversion efficiency of the solar battery cell 1.

Specifically, in the solar battery cell 1, in the texture (square pyramid) manufacturing step by alkali wet etching, the length L of one side of the square forming the bottom surface of the square pyramid included in the texture structure is varied in the light-receiving region and the lower region of the light-receiving surface side electrode. In the light-receiving region having a close correlation with improvement of the short-circuit current density, the length L of one side of the square forming the bottom surface of the square pyramid included in the texture structure is set in a range of 2 micrometers to 12 micrometers. In the lower region of the light-receiving surface side electrode, which is a region where light is not received on the light-receiving surface side of the solar battery cell, the length L of one side of the square forming the bottom surface of the square pyramid included in the texture structure is set in a range of 12 micrometers to 22 micrometers. Consequently, it is possible to adopt satisfactory conditions for each of the short-circuit current density and the fill factor. It is possible to manufacture a solar battery cell excellent in the photoelectric conversion effect by improving both of the short-circuit current density and the fill factor in a well-balanced state.

In the above explanation, the manufacturing of the silicon solar battery cell in which the monocrystal silicon substrate is used as the semiconductor substrate is explained as an example. However, in the present invention, as long as formation of the texture structure of the square pyramid is possible, the effects can be obtained in the same manner when a substrate formed of a material other than silicon is used as the semiconductor substrate and when a substrate formed of crystal other than monocrystal is used as the semiconductor substrate.

INDUSTRIAL APPLICABILITY

As explained above, the solar battery cell and the method of manufacturing the solar battery cell according to the present invention is useful for realizing a solar battery cell having well-balanced electric characteristics and excellent in photoelectric conversion efficiency.

REFERENCE SIGNS LIST 1 solar battery cell
2 semiconductor substrate
2a texture structure
2b texture structure
3 n-type dopant diffusion layer
4 reflection preventing film
5 front silver grid electrode
6 front silver bus electrode
7 rear aluminum electrode
7a aluminum paste
8 rear silver electrode
9 p+ layer (BSF (Back Surface Field))
11 semiconductor substrate
12 light-receiving surface side electrode
12a silver paste
13 rear surface side electrodes
21 mask film
21a opening

The invention claimed is:

1. A solar battery cell comprising:
a semiconductor substrate of a first conduction type including, on one surface side, a dopant diffusion layer in which a dopant element of a second conduction type is diffused;
a light-receiving surface side electrode electrically connected to the dopant diffusion layer and formed on the one surface side of the semiconductor substrate; and
a rear surface side electrode formed on an opposite surface side of the semiconductor substrate, wherein
the one surface side comprises a first region in which the light-receiving surface side electrode is not formed, and a second region in which the light-receiving electrode is formed;
the solar battery cell includes a first unevenness structure including first projected sections each having a substantial square pyramid shape disposed in the first region in which the light-receiving surface side electrode is not formed on the one surface side of the semiconductor substrate including the dopant diffusion layer, and not disposed in the second region of the one surface side,
the solar battery cell includes a second unevenness structure including second projected sections each having a substantial square pyramid shape disposed in the second region where the light-receiving surface side electrode is formed on the one surface side of the semiconductor substrate including the dopant diffusion layer, and not disposed in the first region of the one surface side, and
a length of one side of a substantial square forming a bottom surface of the substantial square pyramid shape of the second projected sections is larger than a length of one side of a substantial square forming a bottom surface of the substantial square pyramid shape of the first projected sections,
wherein the second projected sections of the second unevenness structure are disposed in a recess in the one surface side of the semiconductor substrate.

2. The solar battery cell according to claim 1, wherein the length of one side of the substantial square forming the bottom surface of the substantial square pyramid shape in the first projected sections of sixty percent or more among the first projected sections included in the first unevenness structure is in a range of 2 micrometers to 12 micrometers, and
the length of one side of the substantial square forming the bottom surface of the substantial square pyramid shape in the second projected sections of sixty percent or more among the second projected sections included in the second unevenness structure is in a range of 12 micrometers to 22 micrometers.

3. The solar battery cell according to claim 2, wherein
in all of the first projected sections, a length of one side of a substantial square forming a bottom surface of the square pyramid shape is in a range of 2 micrometers to 12 micrometers, and
in all of the second projected sections, a length of one side of a substantial square forming a bottom surface of the square pyramid shape is in a range of 12 micrometers to 22 micrometers.

4. The solar battery cell according to claim 1, wherein the semiconductor substrate is a silicon substrate.

5. A method of manufacturing a solar battery cell including a light-receiving surface side electrode on one surface side of a semiconductor substrate, the method comprising:
a first step of applying anisotropic etching to one surface side of a semiconductor substrate of a first conduction type and forming, on the one surface side of the semiconductor substrate, a first unevenness structure including first projected sections each having a substantial square pyramid shape;
a second step of further applying the anisotropic etching to a formation region of the light-receiving surface side electrode on the one surface side of the semiconductor substrate and forming, in the formation region of the light-receiving surface side electrode of the semiconductor substrate, a second unevenness structure including second projected sections each having a substantial square pyramid shape larger than the first projected sections, the second projected sections being disposed in a recess in the one surface side of the semiconductor substrate;
a third step of diffusing a dopant element of a second conduction type and forming a dopant diffusion layer on the one surface side of the semiconductor substrate;
a fourth step of forming, in a region where the second unevenness structure is formed on the one surface side of the semiconductor substrate, the light-receiving surface side electrode electrically connected to the dopant diffusion layer; and
a fifth step of forming a rear surface side electrode on an opposite surface side of the semiconductor substrate.

6. The method of manufacturing the solar battery cell according to claim 5, wherein
a length of one side of a substantial square forming a bottom surface of the square pyramid shape in the first projected sections of sixty percent or more among the first projected sections included in the first unevenness structure is in a range of 2 micrometers to 12 micrometers, and
a length of one side of a substantial square forming a bottom surface of the square pyramid shape in the second projected section of sixty percent or more among the second projected sections included in the second unevenness structure is in a range of 12 micrometers to 22 micrometers.

7. The method of manufacturing the solar battery cell according to claim 6, wherein
in all of the first projected sections, a length of one side of a substantial square forming a bottom surface of the square pyramid shape is in a range of 2 micrometers to 12 micrometers, and
in all of the second projected sections, a length of one side of a substantial square forming a bottom surface of the square pyramid shape is in a range of 12 micrometers to 22 micrometers.

8. The method of manufacturing the solar battery cell according to claim 5, wherein
the semiconductor substrate is a silicon substrate, and
the first unevenness structure and the second unevenness structure are formed by performing anisotropic etching using an alkali solution.

* * * * *